(12) United States Patent
Yang et al.

(10) Patent No.: US 12,525,502 B2
(45) Date of Patent: Jan. 13, 2026

(54) SEMICONDUCTOR PACKAGING DEVICE AND HEAT DISSIPATION COVER THEREOF

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Sheng-Fan Yang, Hsinchu (TW); Yen-Chao Lin, Hsinchu (TW); Chi-Ming Yang, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 471 days.

(21) Appl. No.: 18/169,212

(22) Filed: Feb. 15, 2023

(65) Prior Publication Data

US 2024/0213112 A1    Jun. 27, 2024

(30) Foreign Application Priority Data

Dec. 23, 2022   (TW) .................................. 111149678

(51) Int. Cl.
*H01L 23/367*   (2006.01)
*H01L 23/00*    (2006.01)
(Continued)

(52) U.S. Cl.
CPC ...... *H01L 23/3675* (2013.01); *H01L 23/3185* (2013.01); *H01L 24/16* (2013.01);
(Continued)

(58) Field of Classification Search
CPC . H01L 23/3675; H01L 23/3185; H01L 24/16; H01L 24/32; H01L 24/29;
(Continued)

(56) References Cited

U.S. PATENT DOCUMENTS 5,623,394 A *  4/1997  Sherif ................. H01L 23/3737
                                                  257/713
8,089,146 B2 * 1/2012  Fukuzono ........... H01L 23/3675
                                                  257/710
(Continued)

FOREIGN PATENT DOCUMENTS

CN           101635284 B    8/2011
CN           206353525 U    7/2017
(Continued)

*Primary Examiner* — Peniel M Gumedzoe
(74) *Attorney, Agent, or Firm* — CKC & Partners Co., LLC

(57) ABSTRACT

A semiconductor packaging device includes a packaging module, a heat dissipation cover and a thermal interface material layer. The package module includes a substrate, and a working chip mounted on the substrate. The heat dissipation cover includes a metal cover fixed on the substrate and covering the working chip, an accommodating recess located on the metal cover to accommodate the working chip, and a plurality of protrusive columns respectively formed on the metal cover and distributed within the accommodating recess at intervals. The depth of the accommodating recess is greater than the height of each protrusive column, and the accommodating recess is greater than the working chip. The thermal interface material layer is non-solid, and located within the accommodating recess between the protrusive columns to wrap the protrusive columns and contact with the working chip, the metal cover and the protrusive columns.

11 Claims, 9 Drawing Sheets

(51) Int. Cl.
*H01L 23/31* (2006.01)
*H01L 25/065* (2023.01)

(52) U.S. Cl.
CPC .......... *H01L 24/32* (2013.01); *H01L 25/0655* (2013.01); *H01L 24/29* (2013.01); *H01L 24/33* (2013.01); *H01L 24/73* (2013.01); *H01L 24/83* (2013.01); *H01L 2224/16227* (2013.01); *H01L 2224/2919* (2013.01); *H01L 2224/32225* (2013.01); *H01L 2224/32257* (2013.01); *H01L 2224/32258* (2013.01); *H01L 2224/33181* (2013.01); *H01L 2224/33505* (2013.01); *H01L 2224/73204* (2013.01); *H01L 2224/73253* (2013.01); *H01L 2224/83192* (2013.01); *H01L 2224/83385* (2013.01); *H01L 2924/0665* (2013.01); *H01L 2924/1616* (2013.01); *H01L 2924/16235* (2013.01); *H01L 2924/18161* (2013.01)

(58) Field of Classification Search
CPC ......... H01L 24/33; H01L 24/73; H01L 24/83; H01L 25/0655; H01L 2224/16227; H01L 2224/2919; H01L 2224/32225; H01L 2224/32257; H01L 2224/32258; H01L 2224/33181; H01L 2224/33505; H01L 2224/73204; H01L 2224/73253; H01L 2224/83192; H01L 2224/83385; H01L 2924/0665; H01L 2924/1616; H01L 2924/16235; H01L 2924/18161
See application file for complete search history.

(56) References Cited

U.S. PATENT DOCUMENTS

| | | | |
|---|---|---|---|
| 2014/0091461 A1* | 4/2014 | Shen | H01L 23/24 257/737 |
| 2015/0187679 A1* | 7/2015 | Ho | H01L 23/055 438/118 |
| 2021/0118767 A1 | 4/2021 | Chi et al. | |

FOREIGN PATENT DOCUMENTS

| | | |
|---|---|---|
| CN | 115132704 A | 9/2022 |
| TW | 415642 U | 12/2000 |
| TW | I297539 B | 6/2008 |

* cited by examiner

SEMICONDUCTOR PACKAGING DEVICE AND HEAT DISSIPATION COVER THEREOF

RELATED APPLICATIONS

This application claims priority to Taiwan Application Serial Number 111149678, filed on Dec. 23, 2022, which is herein incorporated by reference in its entirety.

BACKGROUND

Field of Disclosure

The present disclosure relates to a semiconductor packaging device and a heat dissipation cover thereof.

Description of Related Art

In recent years, with the requirements of high functionality and miniaturization to a semiconductor packaging module, due to higher heat generation thereof, the semiconductor packaging module requires a suitable heat dissipation technique to effectively dissipate heat energy.

However, the conventional heat dissipation architecture for the semiconductor packaging module has gradually become difficult to meet the requirements. Therefore, if there is no good heat dissipation technique, the stability and product life of the semiconductor packaging module will be critically reduced.

Therefore, the above-mentioned technology apparently is still with inconvenience and defects and needed to be further develop. Hence, how to develop a solution to improve the foregoing deficiencies and inconvenience is an important issue that relevant persons engaged in the industry are currently unable to delay.

SUMMARY

One aspect of the present disclosure is to provide a semiconductor packaging device and a heat dissipation cover thereof for solving the difficulties mentioned above in the prior art.

In one embodiment of the present disclosure, a semiconductor packaging device is provided, and the semiconductor packaging device includes a packaging module, a heat dissipation cover and a thermal interface material layer. The package module includes a substrate, and a working chip mounted on one surface of the substrate. The heat dissipation cover includes a metal cover, an accommodating recess and a plurality of protrusive columns. The metal cover is fixed on the surface of the substrate and covers the working chip. The accommodating recess is located on one surface of the metal cover facing towards the working chip to accommodate the working chip. The protrusive columns are respectively formed on the metal cover and distributed within the accommodating recess at intervals. A depth of the accommodating recess is greater than a height of each of the protrusive columns, and an area of the accommodating recess is greater than an area of the working chip. The thermal interface material layer, which is non-solid, is located within the accommodating recess between the protrusive columns, wraps the protrusive columns to be in direct contact with the working chip, the metal cover and the protrusive columns.

In one embodiment of the present disclosure, a heat dissipation cover is provided, and the heat dissipation cover includes a metal cover, an accommodating recess and a plurality of protrusive columns. The metal cover is used to cover a working chip. The accommodating recess is located on one surface of the metal cover to accommodate the working chip. The protrusive columns are respectively formed on the metal cover and distributed within the accommodating recess at intervals. A depth of the accommodating recess is greater than a height of each of the protrusive columns, and an area of the accommodating recess is greater than an area of the working chip.

Thus, through the construction of the embodiments above, the disclosure can provide better heat dissipation technique to effectively improve the heat dissipation performance, thereby greatly improving the stability and product life of the semiconductor packaging module.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
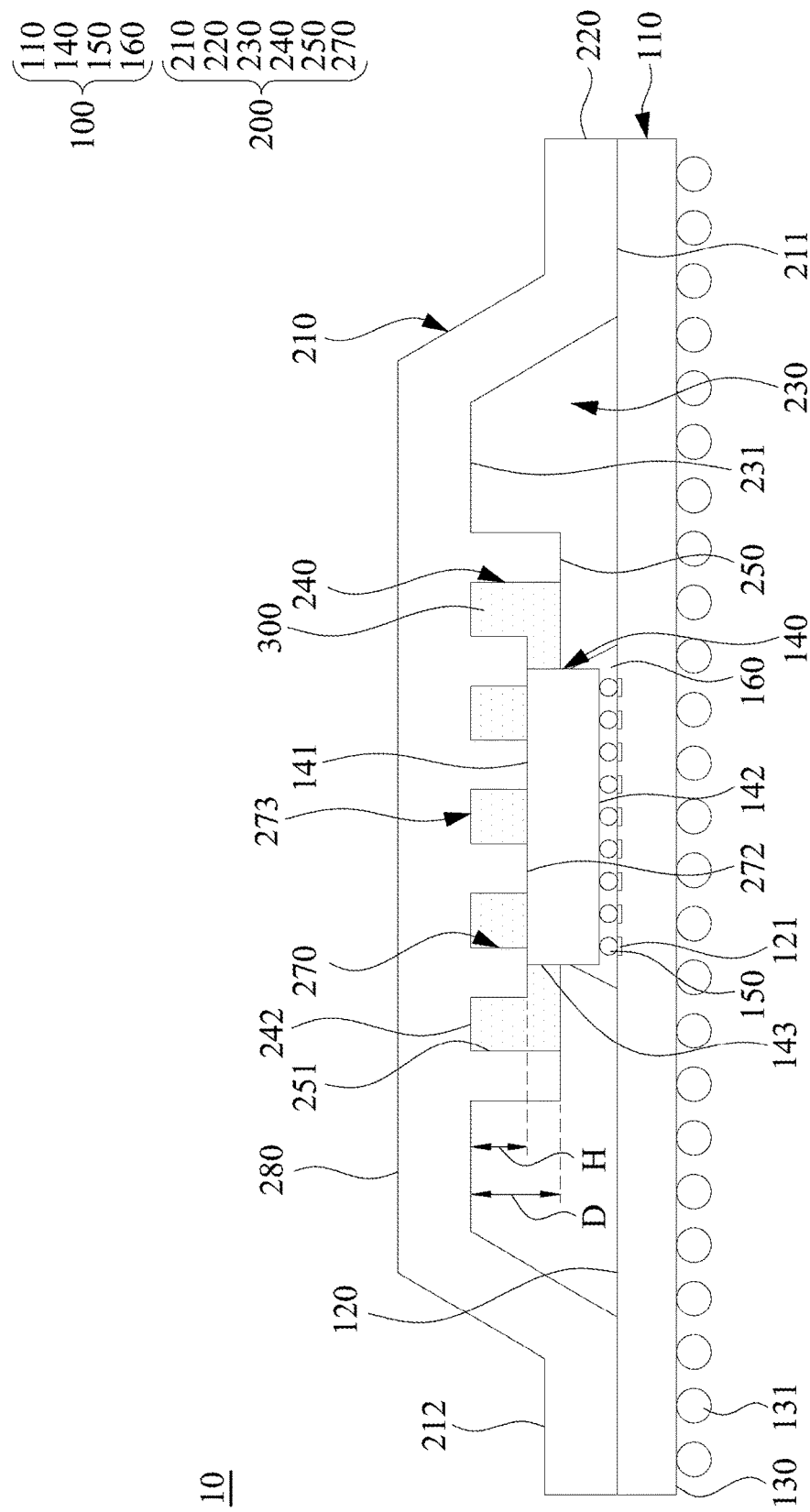
FIG. 1 is a cross-sectional view of a semiconductor packaging device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
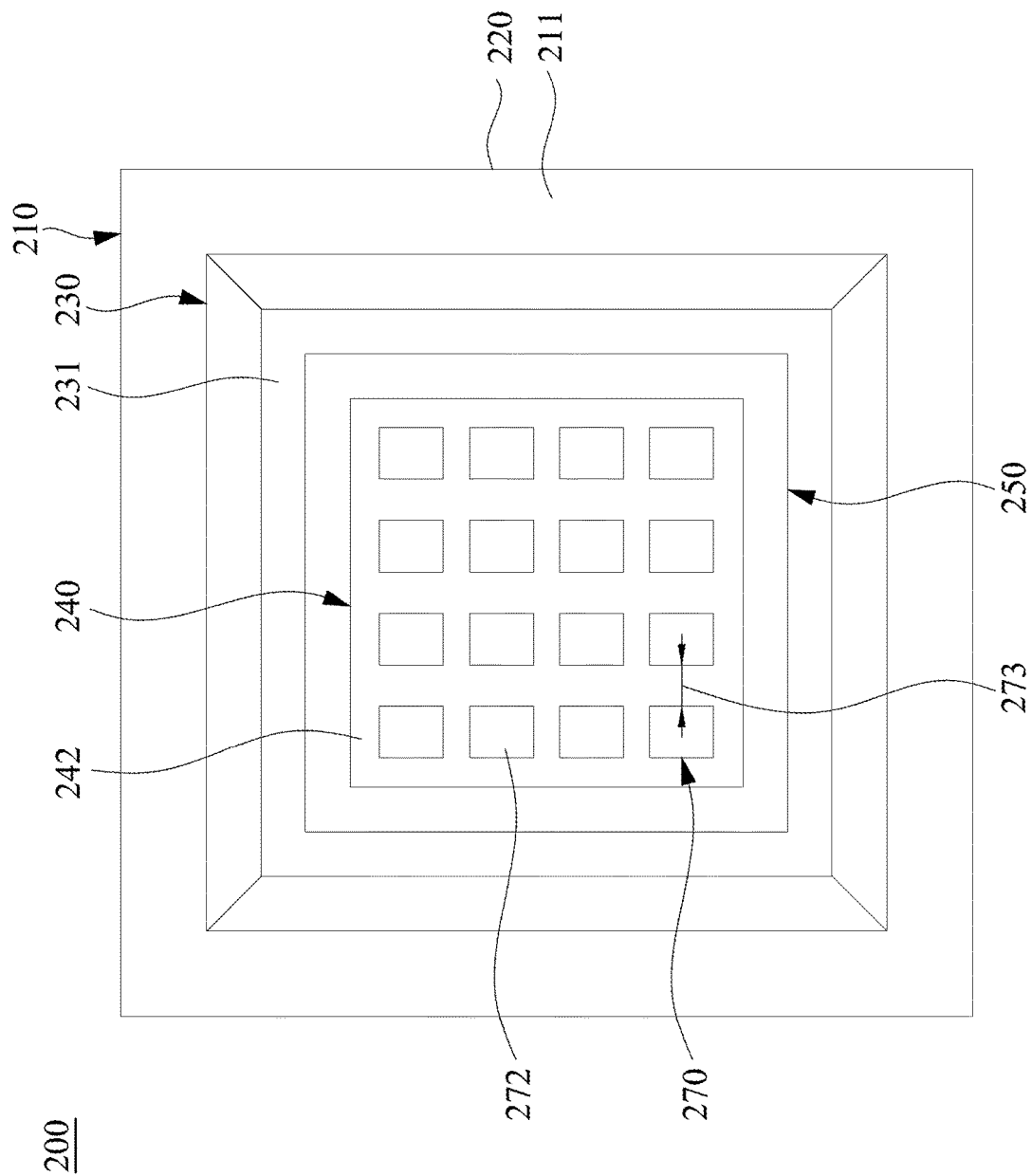
FIG. 2 is a bottom view of a heat dissipation cover viewed in FIG. 1.

Reference is now made to FIG. 1, in which FIG. 1 is a cross-sectional view of a semiconductor packaging device according to one embodiment of the present disclosure and FIG. 2 is a bottom view of a heat dissipation cover viewed in FIG. 1. As shown in FIG. 1 and FIG. 2, in this embodiment, the semiconductor packaging device 10 includes a packaging module 100, a heat dissipation cover 200 and a thermal interface material layer 300 (called TIM layer 300 hereinafter). The package module 100 includes a substrate 110 and a working chip 140. The substrate 110 includes a top surface 120 and a bottom surface 130 which are opposite to each other. The working chip 140 is mounted (e.g., soldered) on the top surface 120 of the substrate 110. The bottom surface 130 of the substrate 110 is provided with a ball grid array (BGA) 131 electrically connected to the working chip 140 through the substrate 110.

The heat dissipation cover 200 includes a metal cover 210, a sunken portion 230, an accommodating recess 240, a raised portion 280 and a plurality of protrusive columns 270. The metal cover 210 includes a first surface 211 and a second surface 212 which are opposite to each other. The sunken portion 230 is formed on the first surface 211, for example, the sunken portion 230 is recessed towards the second surface 212 from the first surface 211. The accommodating recess 240 is formed on a bottom surface 231 of the sunken portion 230, and faces towards the working chip 140 of the packaging module 100. The raised portion 280 is formed on the second surface 212 of the metal cover 210, protrudes towards a direction facing away from the top surface 120 of the substrate 110, and is arranged corresponding to the sunken portion 230. The protrusive columns 270 are respectively formed on the metal cover 210 and distributed within the accommodating recess 240 at intervals. Each of the protrusive columns 270 protrudes towards the top surface 120 of the substrate 110 from the bottom surface 231 of the sunken portion 230. Thus, when the metal cover 210 covers the working chip 140 and the top surface 120 of the substrate 110, and the first surface 211 of the metal cover 210 is fixed on the top surface 120 of the substrate 110, the working chip 140 is completely accommodated within the sunken portion 230, and the accommodating recess 240 allows one part of the working chip 140 to extend therein, and the part of the working chip 140 extends into the TIM layer 300 filled within the accommodating recess 240, and the protrusive columns 270 are in direct contact with the working chip 140, so that the working chip 140 is fixed between the substrate 110 and the protrusive columns 270.

It is noted, a depth D of the accommodating recess 240 is greater than a height H of each of the protrusive columns 270. An area of the accommodating recess 240 is greater than an area of the working chip, and the area of the working chip 140 is, for example, an area of the top portion 141 of the working chip 140. However, the disclosure is not limited to the above. In other embodiments, the heat dissipation cover 200 may have no sunken portion 230; or, the depth of the accommodating recess 240 may also accommodate the total volume of the working chip 140; It is also possible that the protrusive columns 270 do not directly (i.e., indirectly) contact the working chip 140.

The thermal interface material (TIM) layer 300 (presented with dots within the figures) is in a non-solid state at a normal temperature, filled or at least filled in the accommodating recess 240, and located within interval space 273 defined between the protrusive columns 270, wraps the protrusive columns 270 to be in direct contact with the working chip 140, the metal cover 210 and the protrusive columns 270. In other words, the TIM layer 300 is fully filled in the slit (including interval space 273) defined in the accommodating recess 240 except the protrusive columns 270 and the working chip 140. The TIM layer 300 is able to quickly transfer the thermal energy of the working chip 140 to the protrusive columns 270 and the metal cover 210, so as to dissipate the thermal energy outwardly from the surfaces of the metal cover 210. The TIM layer 300 is, for example, thermal grease, silicon gel (also known as thermal gel or thermal gel), thermal pad and thermal conductive adhesive.

More specifically, the heat dissipation cover 200 further includes a convex barrier portion 250 convexly provided on one surface of the metal cover 210 facing towards the working chip 140 (e.g., bottom surface 231 of the sunken portion 230), so as to define the accommodating recess 240 described above, that is, plural inner surfaces 251 of the convex barrier portion 250 collectively surround to form the accommodating recess 240 described above for confining the TIM layer 300. For example, the convex barrier portion 250 includes a continuous outline, such as a rectangle (such as a square shape or a long ring shape). The convex barrier portion 250 have no gap thereon, and the convex barrier portion 250 is able to limit the location of the TIM layer 300 so that the TIM layer 300 will not flow to any area of the metal cover 210 outside the accommodating recess 240. However, the disclosure is not limited to the above. In other embodiments, the continuous outline may also be circular; the convex barrier portion 250 may also be a discontinuous outline; or the heat dissipation cover 200 may be provided without the aforementioned convex barrier portion 250.

In the embodiment, the protrusive columns 270 are arranged at intervals in the accommodating recess 240 in an array. Each of the protrusive columns 270 is straightly arranged at the bottom 242 of the accommodating recess 240, in other words, each of the protrusive columns 270 extends outwards from the metal cover 210, one end surface 272 of each of the protrusive columns 270 facing away from the metal cover 210 is a free end located within the TIM layer 300. In this embodiment, the protrusive columns 270 and the metal cover 210 are integrally formed, that is, the protrusive columns 270 and the metal cover 210 are both made of metal. However, the disclosure is not limited to the formation method and appearance of the protrusive columns 270.

Moreover, the metal cover 210 further includes a flange 220 which is hollow-square-shaped. The flange 220 completely surrounds the sunken portion 230, and one surface of the flange 220 of the metal cover 210 is fixedly connected to the top surface 120 of the substrate 110. In this embodiment, when the metal cover 210 covers the working chip 140 and the top surface 120 of the substrate 110, the flange 220 of the metal cover 210 is fixed on the top surface 120 of the substrate 110 through adhesive (not shown figures), however, the disclosure is not limited to the above. In other embodiments, the heat dissipation cover 200 may be provided without flange 220 mentioned above.

In the embodiment, the working chip 140 is a single die, and includes a top portion 141, a bottom portion 142 and a plurality of adjoining surfaces 143. The top portion 141 of the working chip 140 is directly contacted with the end surfaces 272 of the protrusive columns 270. The bottom portion 142 is opposite to the top portion 141, and connected to the top surface 120 of the substrate 110. The adjoining surfaces 143 collectively surround and adjoin the top portion 141 and the bottom portion 142 of the working chip 140. The bottom portion 142 of the working chip 140 is provided with solder balls 150, and the top surface 120 of the substrate 110 is provided with solder pads 121. The solder balls 150 of the working chip 140 are soldered to the solder pads 121 of the substrate 110, respectively, so that the working chip 140 is electrically connected to the substrate 110 and the ball grid array (BGA) 131. A protective layer 160 is further provided between the working chip 140 and the substrate 110, and the protective layer 160 collectively surrounds and protects the solder ball 150 and the solder pads 121 together. For example, the protection layer 160 is epoxy resin or similar material, however, the disclosure is not limited thereto. The TIM layer 300 is in direct contact with the top portion 141 and these adjoining surfaces 143 of the working chip 140, or at least in direct contact with the top portion 141 of the working chip 140 only.

In another option of the semiconductor packaging device 10 shown in FIG. 1, the working chip 140 is formed with a heat conduction channel (e.g., through silicon via, TSV, not shown in figures), and the heat conduction channel passes through the top portion 141 and the bottom portion 142 of the working chip 140. Therefore, compared with a semiconductor packaging device being provided without the aforementioned heat conduction channel, the semiconductor packaging device of this embodiment may have less thermal resistance (Theta JC, C/W), however, the disclosure is not limited to the above.

Figure 3A:
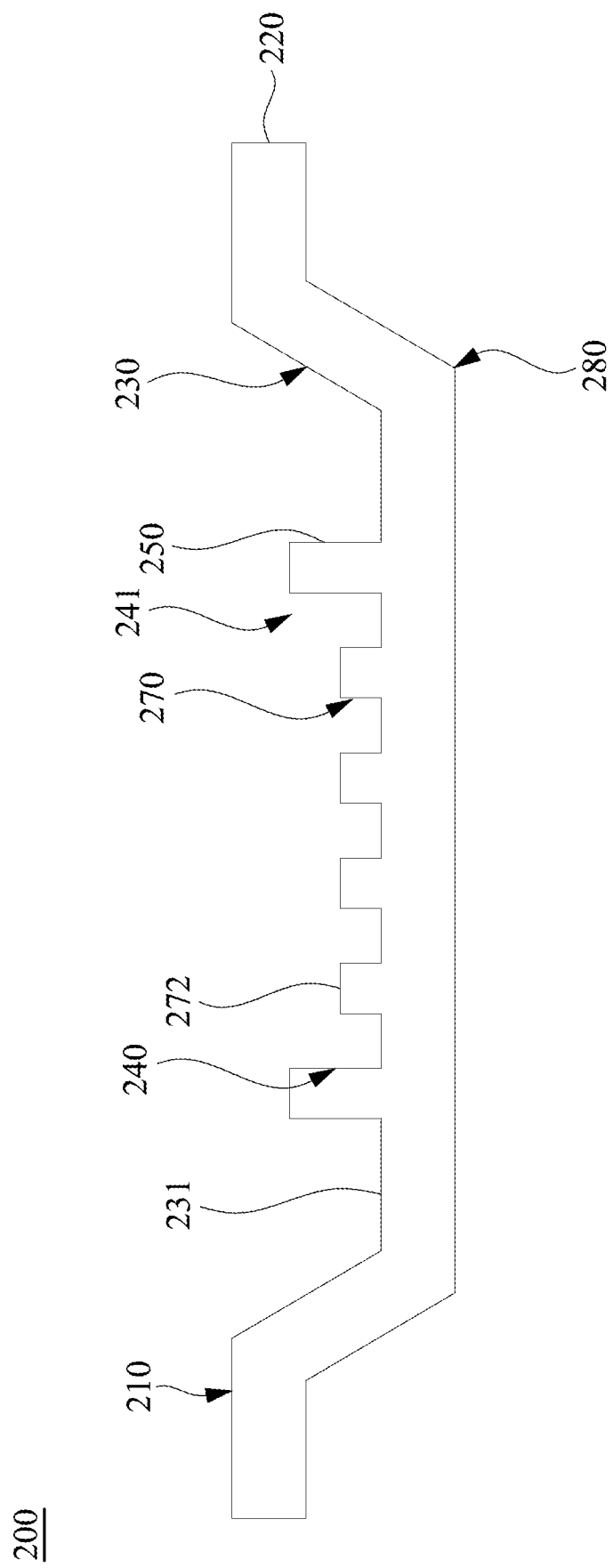
FIG. 3A to FIG. 3D are assembly sequence views of a semiconductor packaging device according to one embodiment of the present disclosure.
Figure 3B:
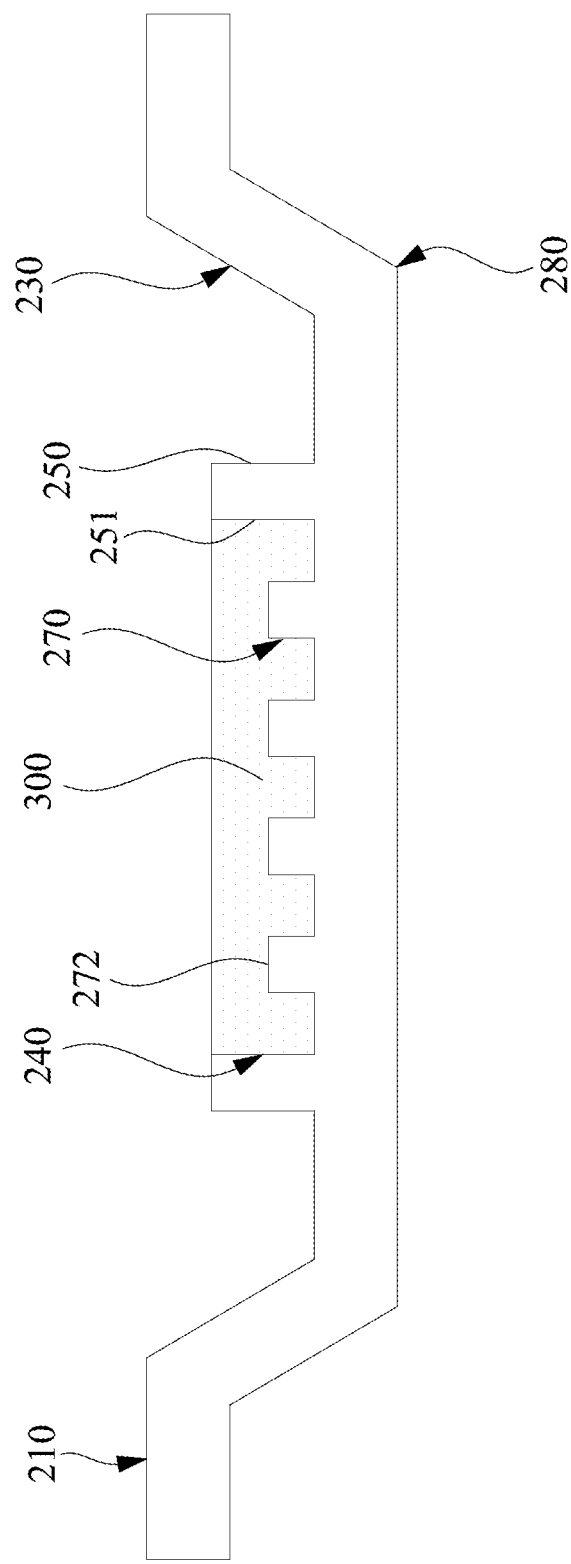
Figure 3C:
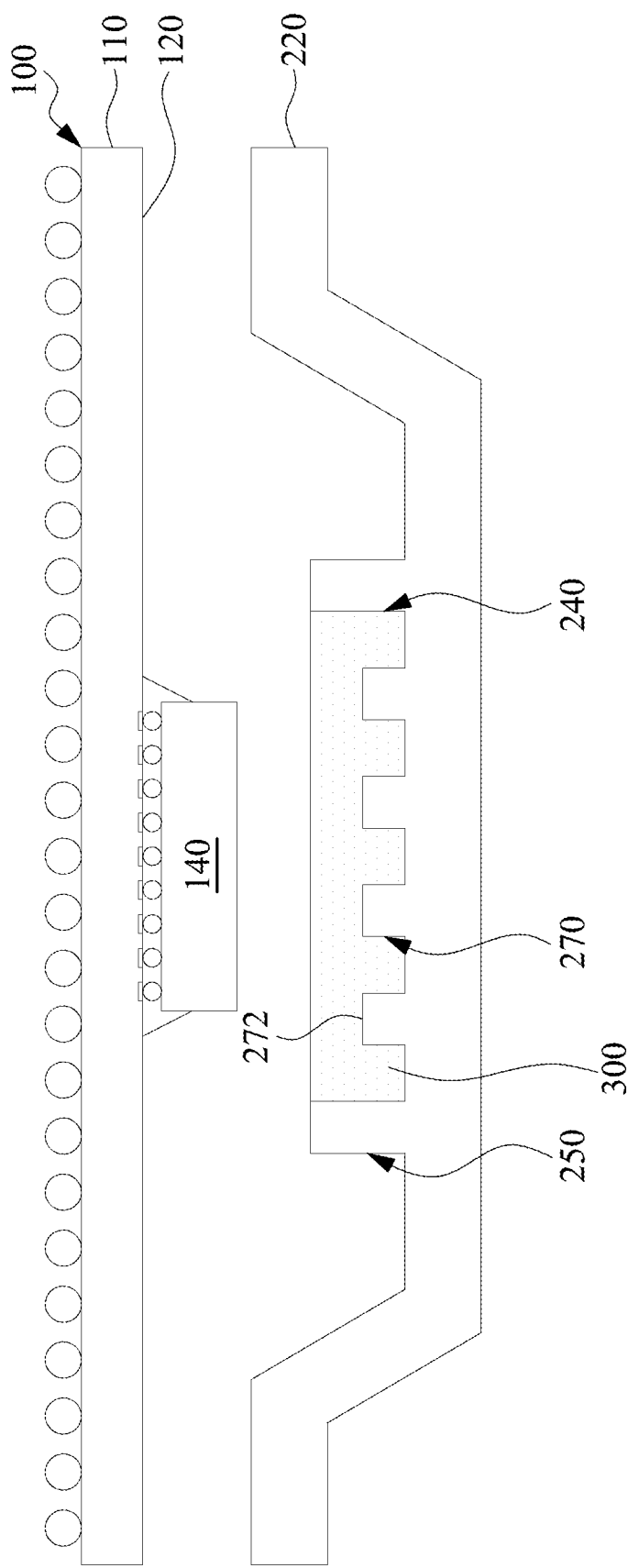
Figure 3D:
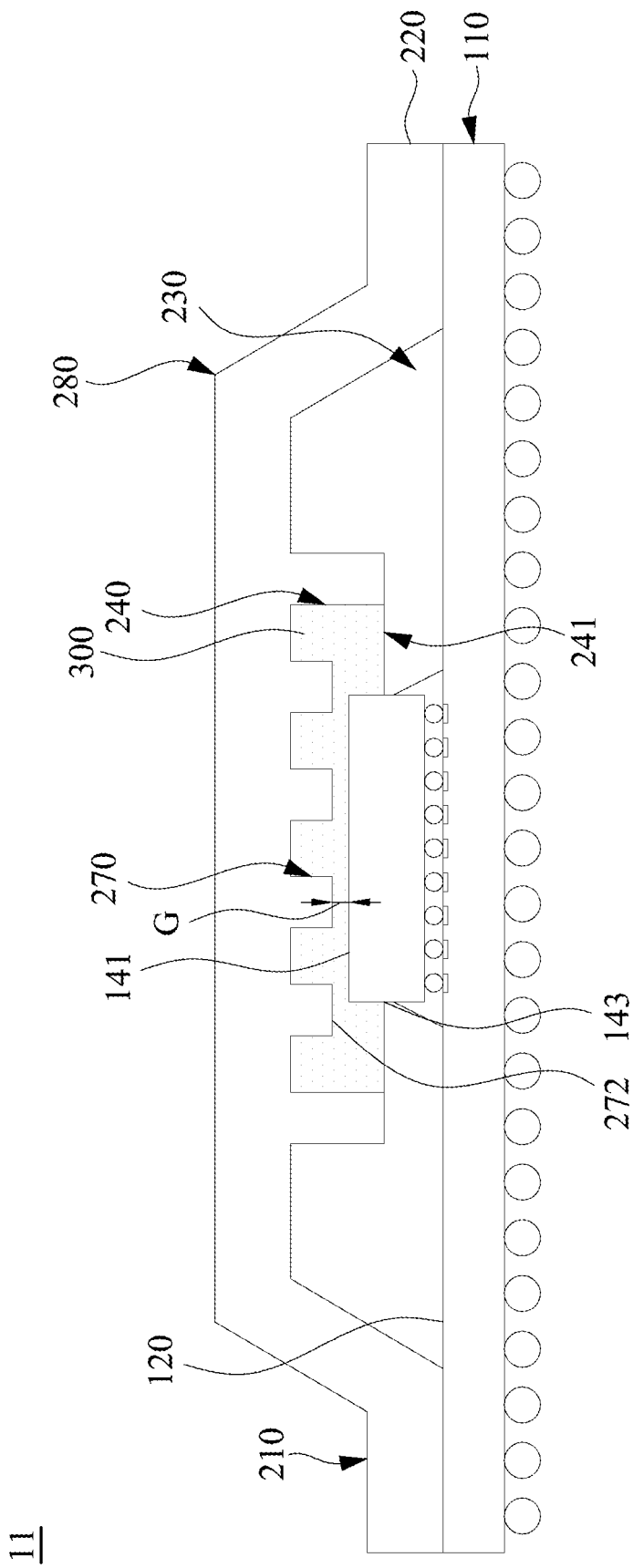

FIG. 3A to FIG. 3D are assembly sequence views of a semiconductor packaging device 11 according to one embodiment of the present disclosure, wherein FIG. 3A is a cross-sectional view of the heat dissipation cover 200. As shown in FIG. 3A, a heat dissipation cover 200 described above is obtained, and the heat dissipation cover 200 is deposited so as to arrange the groove opening 241 of the accommodating recess 240 to face up. Next, as shown in FIG. 3B, the TIM layer 300 mentioned above is filled into the accommodating recess 240 of the heat dissipation cover 200 so that the TIM layer 300 can be confined by the convex barrier portion 250, and prevent from overflowing to any other area of the metal cover 210 outside the accommodating recess 240. Next, as shown in FIG. 3C and FIG. 3D, a packaging module 100 described above is obtained, and the packaging module 100 is turned over to arrange the working chip 140 of the packaging module 100 to protrude downwardly. Next, the flange 220 of the metal cover 210 which is fixedly adhered to the top surface 120 of the substrate 110 through an adhesive (not shown in figures), and the working chip 140 which downwardly immerses into the TIM layer 300 located in the accommodating recess 240 are operated at the same time, wherein the working chip 140 is not directly contacted with the end surface 272 of each of the protrusive columns 270 so that a partition space G is kept between the working chip 140 and the protrusive columns 270, a part of the TIM layer 300 is fully filled in the partition space G, and the end surface 272 of each of the protrusive columns 270 is in direct contact with the TIM layer 300. Next, as shown in FIG. 3D, the semiconductor packaging device 11 is turned over and obtained.

It is noted, when the semiconductor package device 11 is turned over to render the groove opening 241 of the accommodating recess 240 to face downward, the protrusive columns 270 in the accommodating recess 240 can also hinder the TIM layer 300 from sliding down, thereby slowing down the movement of the TIM layer 300.

Figure 4:
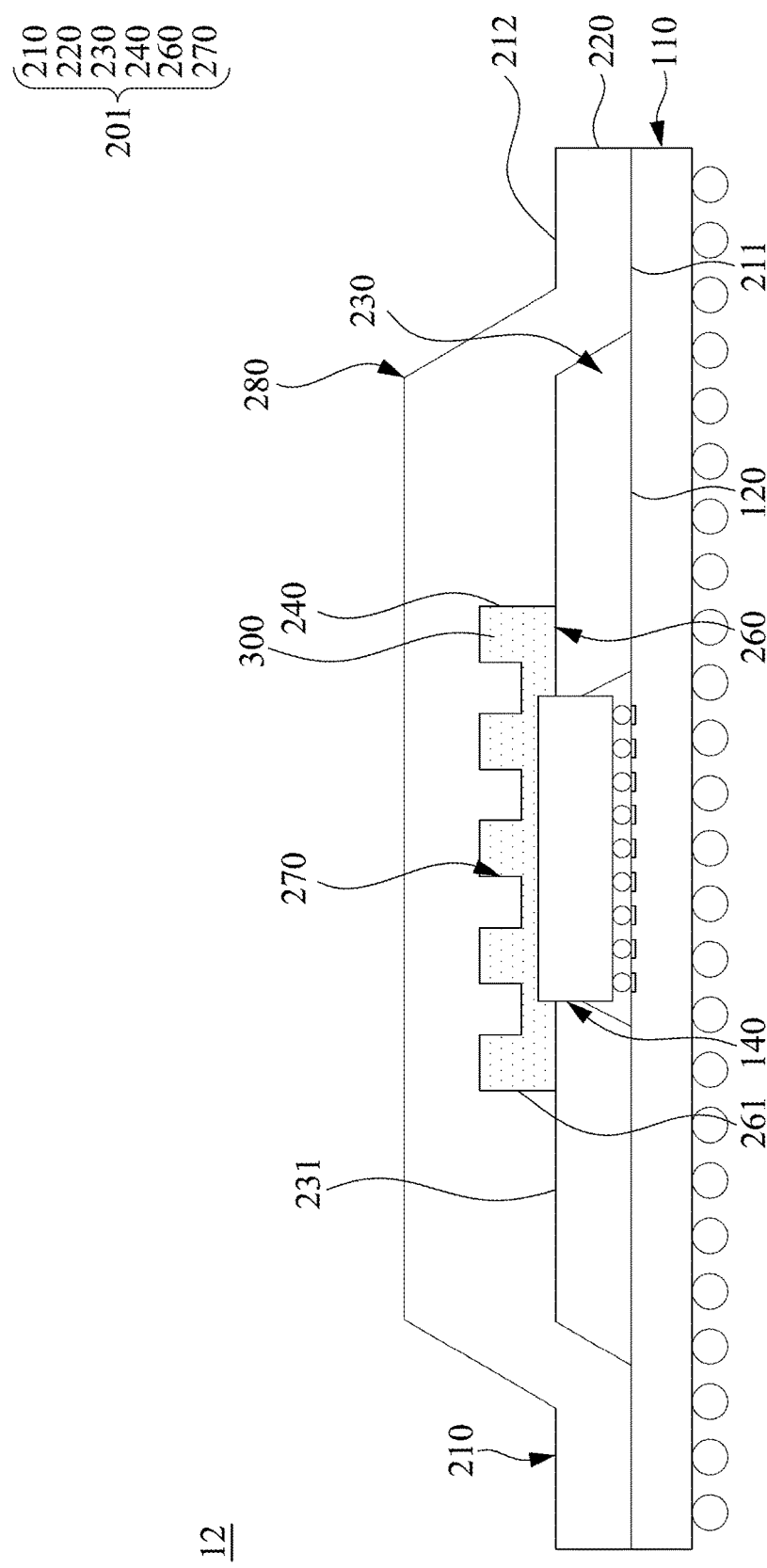
FIG. 4 is a cross-sectional view of a semiconductor packaging device according to one embodiment of the present disclosure.
Figure 5:
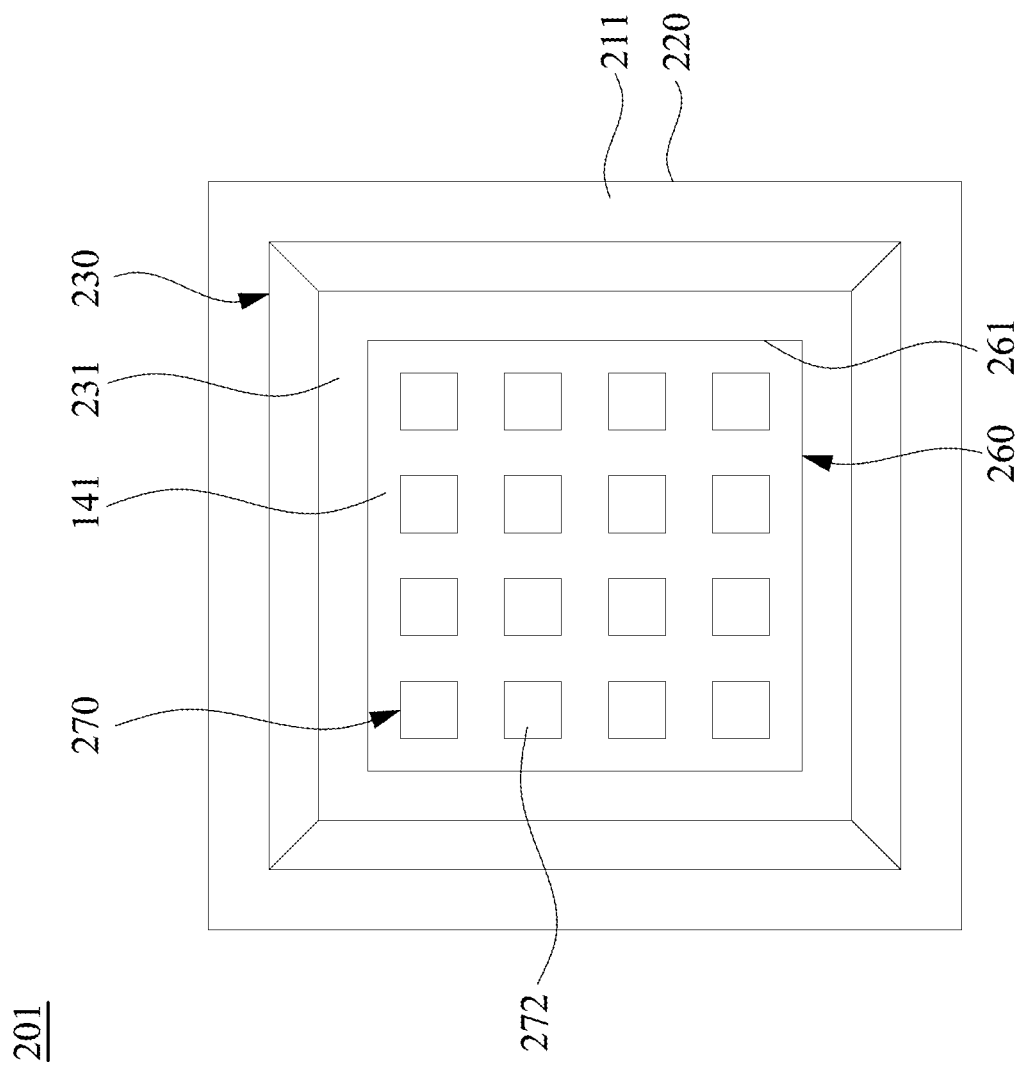
FIG. 5 is a bottom view of a heat dissipation cover viewed in FIG. 4.

FIG. 4 is a cross-sectional view of a semiconductor packaging device 12 according to one embodiment of the present disclosure, and FIG. 5 is a bottom view of a heat dissipation cover 201 viewed in FIG. 4. As shown in FIG. 4 and FIG. 5, the semiconductor package device 12 of the embodiment and the semiconductor package device 10 of FIG. 1 are substantially the same, except that the heat dissipation cover 201 further includes a groove portion 260 rather than the convex barrier portion mentioned above. The groove portion 260 is formed on one surface (i.e., the bottom surface 231 of the sunken portion 230) of the metal cover 210 facing towards the working chip 140 so as to define the accommodating recess 240 mentioned above, that is, plural inner sidewalls 261 of the groove portion 260 collectively surround to define the accommodating recess 240 mentioned above, so that the TIM layer 300 is confined in the accommodating recess 240. For example, the groove portion 260 is rectangular (such as a square shape or a long ring shape), which can limit the location of the TIM layer 300, so that the TIM layer 300 will not flow to any area of the metal cover 210 outside the accommodating recess 240. However, the disclosure is not limited to the above, and the groove portion 260 may also be circular in other embodiments.

It is noted that since the accommodating recess 240 of this embodiment is indented inside the heat dissipation cover 201 to form the groove portion 260 of the heat dissipation cover 201, the overall thickness of the semiconductor package device 12 can be effectively reduced.

Figure 6:
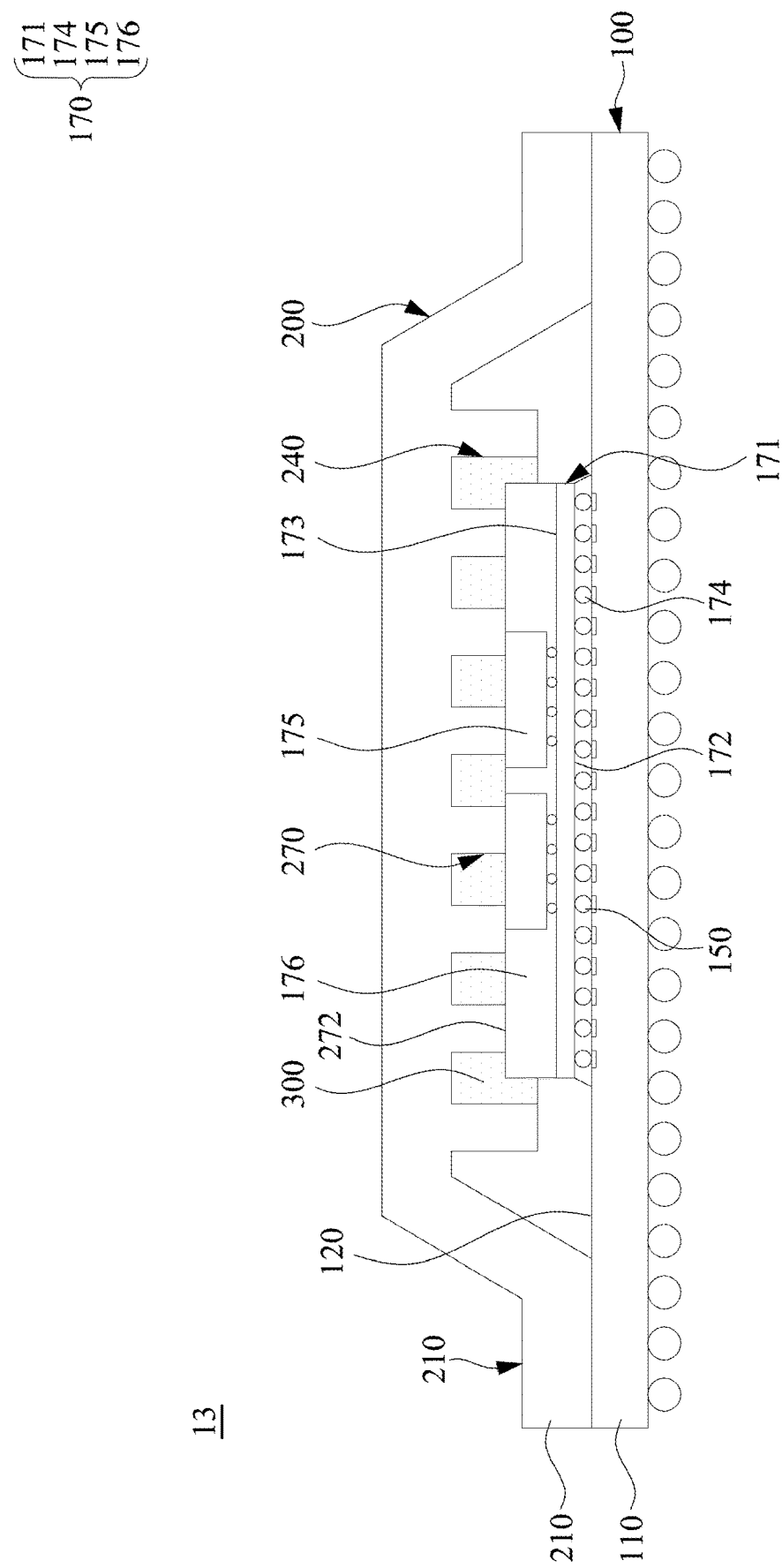
FIG. 6 is a cross-sectional view of a semiconductor packaging device according to one embodiment of the present disclosure.

FIG. 6 is a cross-sectional view of a semiconductor packaging device 13 according to one embodiment of the present disclosure. The semiconductor package device 13 of the embodiment and the semiconductor package device 10 of FIG. 1 are substantially the same, except that the working chip 170 of the semiconductor packaging device 13 shown in FIG. 6 is a composite chip in the embodiment, rather than a single die. The working chip 170 includes a base plate 171, a plurality of soldering contacts 174, a plurality of dies 175 and an encapsulation portion 176. The base plate 171 includes a first surface 172 and a second surface 173 which are opposite to each other. The soldering contacts 174 are spaced arranged on the first surface 172 of the base plate 171 for soldering on the top surface 120 of the substrate 110. The dies 175 are respectively soldered on the second surface 173 of the base plate 171, spaced arranged on the second surface 173 of the base plate 171, and electrically connected to the soldering contacts 174 through wires (not shown in figures) inside the base plate 171. The encapsulation portion 176 is hermetically wrapped the dies 175 on the base plate 171 together, and the encapsulation portion 176 is partially extended into the accommodating recess 240, and thermally connected to the TIM layer 300. In this embodiment, the end surfaces 272 of the protrusive columns 270 in the receiving groove 240 are respectively contact with the encapsulation portion 176 and the dies 175, that is, the dies 175 are located within the accommodating recess 240, and thermally connected to the protrusive columns 270.

Please refer to Table 1 below, which is a comparison of the environmental data of devices A, B and C, respectively. A plurality of conductors (i.e., protrusive columns 270) of the device A (i.e., semiconductor packaging device 10 in FIG. 1) are directly contacted with the working chip 140. A plurality of conductors (i.e. protrusive columns 270) of the device B (i.e., semiconductor packaging device 10 in FIG. 3D) are indirectly contacted with the working chip 140. A single conductor of the device C is thermally connected to the working chip 140 through the TIM layer 300.

TABLE 1

|  | Device A | Device B | Device C |
| --- | --- | --- | --- |
| thermal resistance (Theta JC, C/W) | 0.027 | 0.039 | 0.053 |
| the partition space (mm) formed between the conductor(s) and the working chip | N/A | 0.01 | 0.01 |
| total area (mm$^2$) of the TIM layer in contact with the working chip | 273.15 | 273.15 | 228.16 |

TABLE 1-continued

|  | Device A | Device B | Device C |
|---|---|---|---|
| total area (mm$^2$) of end surfaces of the conductor(s) | 190.08 | 190.08 | 253.51 |
| thickness (mm$^2$) from conductor(s) to working chip | 0.13 | 0.13 | 0.13 |

Thus, as seen in Table 1, although the area (253.51 mm2) of the end surface of the single conductor of the device C is greater than the total area (190.08 mm2) of the conductors of the devices A and B, however, because the devices A and B are provided with the conductors that are distributed at intervals (i.e., protrusive columns 270), any thermal resistance of the devices A and B is still smaller than that of the device C so as to provide better heat dissipation performance. In addition, since the conductors (i.e., protrusive columns 270) of the device A (i.e., the semiconductor packaging device 10, FIG. 1) are directly contacted with the working chip 140, the thermal resistance of the device A (i.e., the semiconductor packaging device 10, FIG. 1) is still smaller than that of device B. (e.g., the thermal resistance of the semiconductor package device 11, FIG. 3D), thereby the device A having better heat dissipation performance.

Thus, through the construction of the embodiments above, the disclosure can provide better heat dissipation technique to effectively improve the heat dissipation performance, thereby greatly improving the stability and product life of the semiconductor packaging module.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A semiconductor packaging device, comprising:
   a package module comprising a substrate, and a working chip mounted on one surface of the substrate, the working chip comprising a base plate, a plurality of soldering contacts, a plurality of dies and an encapsulation portion, the base plate having a top surface and a bottom surface opposite to each other, the soldering contacts spaced arranged on the bottom surface of the base plate for soldering on the one surface of the substrate, the dies respectively soldered on the top surface of the base plate and electrically connected to the soldering contacts through the base plate, and the encapsulation portion hermetically wrapping the dies on the base plate together;
   a heat dissipation cover comprising a metal cover, an accommodating recess and a plurality of protrusive columns, the metal cover fixed on the one surface of the substrate and covering the working chip, the metal cover provided with a first surface and a second surface opposite to each other, and the first surface of the metal cover facing towards the substrate, the accommodating recess located on the first surface of the metal cover to accommodate the working chip, and the protrusive columns respectively formed on the metal cover and distributed within the accommodating recess at intervals, wherein a depth of the accommodating recess is greater than a height of each of the protrusive columns, and an area of the accommodating recess is greater than an area of the working chip; and
   a thermal interface material layer, which is non-solid, located within the accommodating recess between the protrusive columns, wrapping the protrusive columns to be in direct contact with the working chip, the metal cover and the protrusive columns,
   wherein the encapsulation portion is partially extended into the accommodating recess, and thermally connected to the thermal interface material layer.

2. The semiconductor packaging device of claim 1, wherein the heat dissipation cover further comprises:
   a raised portion located on the second surface of the metal cover facing away from the substrate; and
   a sunken portion located on the first surface of the metal cover, arranged correspondingly to the raised portion, for completely receiving the working chip therein, wherein the accommodating recess is formed on a bottom surface of the sunken portion.

3. The semiconductor packaging device of claim 2, wherein the heat dissipation cover further comprises a convex barrier portion convexly provided on the bottom surface of the sunken portion, and completely surrounding the accommodating recess for confining the thermal interface material layer therein.

4. The semiconductor packaging device of claim 3, wherein the convex barrier portion comprises a continuous outline, and the continuous outline is in one of a rectangle and a circle.

5. The semiconductor packaging device of claim 2, wherein the heat dissipation cover further comprises a groove portion formed on the bottom surface of the sunken portion facing towards the working chip and provided with inner sidewalls collectively defining the accommodating recess, so that the thermal interface material layer is confined in the accommodating recess.

6. The semiconductor packaging device of claim 2, wherein the metal cover further comprises a flange which is hollow-square-shaped, and the flange completely surrounds the sunken portion, and one surface of the flange of the metal cover is fixedly connected to the one surface of the substrate.

7. The semiconductor packaging device of claim 1, wherein the protrusive columns respectively directly contact with the working chip.

8. The semiconductor packaging device of claim 1, wherein a partition space is formed between the working chip and the protrusive columns, and the thermal interface material layer is filled in the partition space.

9. The semiconductor packaging device of claim 8, wherein an end surface of each of the protrusive columns directly contacts with the thermal interface material layer.

10. The semiconductor packaging device of claim 1, wherein the protrusive columns are respectively in a linear shape, and straightly arranged at a bottom of the accommodating recess.

11. The semiconductor packaging device of claim 1, wherein the thermal interface material layer is fully filled within a slit defined in the accommodating recess except the protrusive columns and the working chip.

* * * * *